United States Patent [19]

Hey et al.

[11] Patent Number: 5,482,739
[45] Date of Patent: Jan. 9, 1996

[54] SILICON NITRIDE DEPOSITION

[75] Inventors: H. Peter W. Hey, San Jose; David W. Carlson, Santa Clara, both of Calif.

[73] Assignee: Applied Materials, Inc., Santa Clara, Calif.

[21] Appl. No.: 381,004

[22] Filed: Jan. 30, 1995

Related U.S. Application Data

[63] Continuation of Ser. No. 100,651, Jul. 30, 1993, abandoned.

[51] Int. Cl.$^6$ .................................................... C23C 16/34
[52] U.S. Cl. ................................. 427/255.2; 427/255.1; 427/255; 427/248.1; 427/314
[58] Field of Search ............................ 427/255.2, 255.1, 427/255, 248.1, 314

[56] References Cited

U.S. PATENT DOCUMENTS

| | | | |
|---|---|---|---|
| 4,996,082 | 2/1991 | Guckel et al. | 427/99 |
| 5,108,792 | 4/1992 | Anderson et al. | |
| 5,179,677 | 1/1993 | Anderson et al. | |

FOREIGN PATENT DOCUMENTS

| | | |
|---|---|---|
| 0095887A1 | 12/1983 | European Pat. Off. |
| 0180397A2 | 5/1986 | European Pat. Off. |
| 1309315 | 12/1989 | Japan |

OTHER PUBLICATIONS

IBM Technical Disclosure Bulletin, vol. 26, No. 3A, Aug. 1983, pp. 1111–1112.
Foutain et al, "The 300° C. processing of silicon using remote plasma techniques for in situ cleaning, epitaxy and oxide/nitride/oxide depositions", MRS. No. 146, (1989) pp. 139–145.

*Primary Examiner*—Roy V. King
*Attorney, Agent, or Firm*—Ashok K. Janah; Peter J. Sgarbossa

[57] ABSTRACT

A process and apparatus for depositing silicon nitride on a substrate 28 is described. The substrate 28 is placed in a deposition zone 24 within a deposition chamber 22, and a process gas comprising a silicon containing gas and a nitrogen containing gas is introduced into the deposition zone 24 through an inlet gas conduit 30. The substrate 28 is heated to a temperature $T_d$ which is sufficiently high to cause the process gas to deposit silicon nitride on the substrate 28, and the resultant process gas byproducts are exhausted through an exhaust gas conduit 32. At least one of the inlet and exhaust gas conduits 30 and 32 are heated to a temperature $T_h$ within the range $\Delta T_h$, wherein all the temperatures $T_h$ are sufficiently higher than $T_c$ the temperature at which process gas condenses in the gas conduits, so that substantially no condensate deposits in the gas conduits, and all the temperatures $T_h$ are sufficiently lower than the deposition temperature $T_d$, so that substantially no silicon nitride deposits in the gas conduits.

11 Claims, 1 Drawing Sheet

SILICON NITRIDE DEPOSITION

This is a continuation of application Ser. No. 08/100,651 filed on Jul. 30, 1993, now abandoned.

BACKGROUND

This invention is related to a method and apparatus for depositing silicon nitride films.

Silicon nitride films having thicknesses between 50–1000 Å are used as capacitor dielectrics, selective oxidation masks and for passivation in integrated circuits. These films are generally deposited by chemical vapor deposition ("CVD") in multiple wafer batch reactors that typically process batches of 50–100 wafers at a time. Typical CVD processes are described in U.S. Pat. No. 3,637,423 to Sestrich, et al.; U.S. Pat. No. 4,442,589 to Doo, et al.; U.S. Pat. No. 4,158,717 to Nelson, et al.; U.S. Pat. No. 4,181,751 to Hall, et al.; and U.S. Pat. No. 4,279,947 to Goldman, et al.—all of which are incorporated herein by this reference.

However, existing multiple wafer reactors and processes for the deposition of silicon nitride have several problems. One problem is that these reactors and processes often deposit a nonuniform silicon nitride film. The thickness and the electrical properties of the film vary across the diameter of each wafer and can also vary from wafer to wafer. This non-uniformity is even more severe for wafers having large diameters (exceeding 8") which are increasingly being used in the semiconductor industry. Processing of large diameter wafers in multiple batch reactors is risky because the entire stack of 50–100 wafers, each wafer typically worth between $500 to $5,000, is at risk.

Another problem with existing silicon nitride processes and reactors is that the wafers are typically exposed to ambient air during the loading and unloading of the wafers from the reactors. Exposure to air and moisture can cause an oxide layer to form on the wafers which inhibits the deposition of a silicon nitride film. Consequently, the oxide layer is typically removed before deposition of the silicon nitride film. This adds a process step and increases the cost of processing the wafer.

Reactors that process a single wafer at a time generally deposit a more uniform film. However, a critical problem with known single wafer reactors and processes is that condensates deposit in the gas conduits and on the reactor walls. These deposits cause the conduits to clog up and require that the reactor be frequently cleaned. Furthermore, the deposits on the reactor walls can eventually fragment and generate particles which contaminate the wafer. It is only in the final stages of the manufacturing process, when the fully processed wafers are each worth between $5,000 to $50,000, that the contamination is discovered, and the entire wafer must be scrapped. Thus, condensate deposits in the gas conduits and on the reactor chamber walls are undesirable.

Therefore, there is a need for a more reliable deposition process and deposition apparatus that can be used to deposit uniform silicon nitride films on large sized wafers without contaminant deposition or oxide formation on the wafer surface.

SUMMARY

The present invention provides a process and apparatus for depositing uniform silicon nitride films on large sized wafers. In the process of the present invention, a substrate is placed in a deposition zone and a process gas comprising a silicon containing gas and a nitrogen containing gas is introduced into the deposition zone through an inlet gas conduit. The substrate is heated to a temperature $T_d$ that is sufficiently high to cause the process gas to deposit silicon nitride on the substrate, with the resultant formation of process gas byproducts. The process gas byproducts are exhausted through an exhaust gas conduit.

At least one of the inlet or exhaust gas conduits are heated to a temperature $T_h$ with the range $\Delta T_h$. All the temperatures $T_h$ in the range $\Delta T_h$ are sufficiently higher than the $T_c$ (the temperature at which the process gas condenses in the inlet and exhaust gas conduits), so that substantially no condensate deposits in tile gas conduits. Also, the temperatures $T_h$ are sufficiently lower than the deposition temperature $T_d$ to substantially preclude silicon nitride deposition in the gas conduits. When the deposition zone is enclosed by a deposition chamber having a wall, preferably, the wall is also maintained at the temperature $T_h$. The temperature $T_h$ is preferably between about 80° to 250° C., and more preferably between about 100° to 170° C.

BRIEF DESCRIPTION OF DRAWINGS

These and other feature, aspects, and advantages of the present invention will become better understood with reference to the following description, appended claims, and the accompanying drawing

DESCRIPTION

Figure 1:
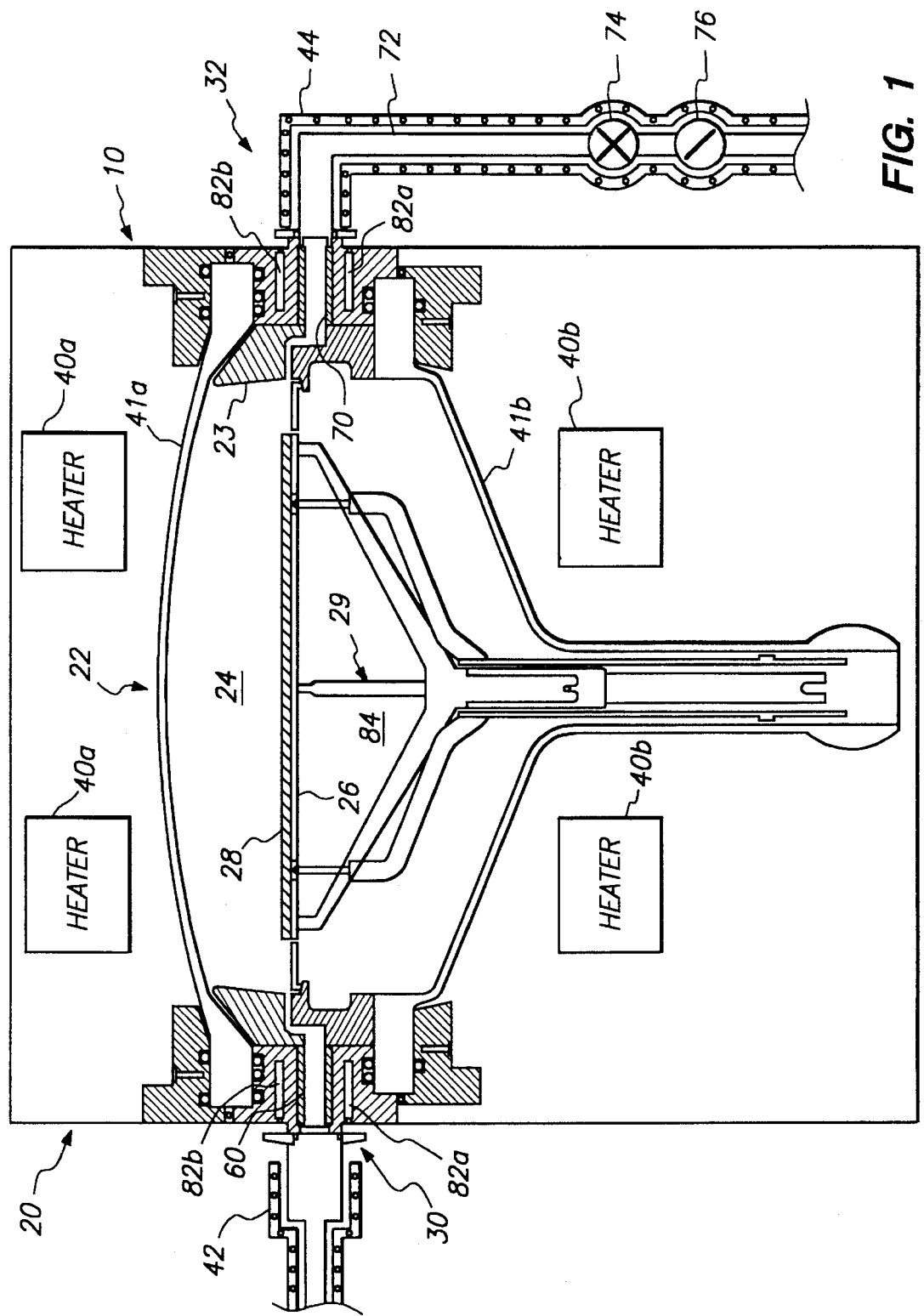
FIG. 1 is a schematic view of a chemical vapor deposition apparatus of the present invention suitable for depositing silicon nitride.

The present invention is directed to a method and apparatus for depositing silicon nitride on a substrate. An apparatus 10 suitable for practicing the process of the present invention is shown in FIG. 1. Portions of the apparatus 10 are described in more detail in U.S. Pat. No. 5,108,792, to Anderson et. al., which is incorporated herein by this reference. The apparatus described in these patents was modified to encompass the features of the present invention as described below.

The apparatus 10 comprises a housing 20 enclosing a deposition chamber 22 having a surrounding wall 23 that defines a deposition zone 24. A holder 26 within the deposition chamber 22 can hold a substrate 28 in the deposition zone 24. The holder 26 optionally comprises a drive assembly 29 that is provided for rotating the substrate 28 to enhance the uniformity of the deposited film. An inlet gas conduit 30 provides process gas to the deposition zone 24, and an exhaust gas conduit 32 exhausts process gas byproducts from the deposition zone 24.

A first heater 40 in the housing 20 is provided for heating the substrate 28 held by the substrate holder 26. The first heater 40 radiantly heats the deposition zone 24 through upper and lower quartz domes 41, and is preferably a symmetrical heater of the type described in U.S. Pat. No. 5,179,677, to Anderson et al., which is incorporated herein by this reference.

The apparatus 10 further comprises at least one second heater consisting of (i) an inlet gas conduit heater 42 for heating the inlet gas conduit 30, and (ii) an exhaust gas conduit heater 44 for heating the exhaust gas conduit 32. The inlet and exhaust heaters 42 and 44 are capable of heating the gas conduits to a temperature $T_h$ within the range $\Delta T_h$, to reduce the deposition of condensate and silicon nitride in the inlet and exhaust gas conduits 30 and 32. The temperature $T_c$ forms the lower end of the range $\Delta T_h$ and is the temperature at which the process gas can react and the reaction byproducts condense to form condensate deposits in the inlet and exhaust gas conduits 30 and 32. The temperature $T_d$ forms the upper end of the range $\Delta T_h$ and is the temperature at which the process gas deposits silicon nitride.

When the process gas comprises dichlorosilane and ammonia, the condensate temperature $T_c$ is about 60° C., and the deposition temperature $T_d$ is about 750° C. as described below. When the process gases are combined, they react to form ammonium chloride which condenses on components such as the gas conduits 30 and 32 which are at temperatures below 60° C. The ammonium chloride condensate that forms in the conduits 30 and 32 can clog the conduits in as few as 3 to 5 deposition runs, necessitating frequent cleaning of the conduits 30 and 32. Thus, the conduits 30 and 32 are maintained at a temperature $T_h$ which is sufficiently higher than the temperature $T_c$ to preclude ammonium chloride condensation in the gas conduits 30 and 32. The temperature $T_h$ must also be sufficiently lower than the deposition temperature $T_d$ to preclude the deposition of silicon nitride in the gas conduits 30 and 32. Thus, the temperature range $\Delta T_h$ is preferably from about 80° to 250° C., and more preferably from about 100° to 170° C.

The inlet gas conduit heater 42 and the exhaust gas conduit heater 44 can comprise flexible silicone heating tapes wrapped around the inlet and exhaust gas conduits 30 and 32. Flexible heating tapes having a power density from about 2 to 6 watts/sq. in. and manufactured by WATLOW, in St. Louis, Mo., or by GLAS-COL in Terra Haute, Ind., or by THERMOLYNE in Dubuque, Iowa, are suitable. The inlet gas conduit heater 42 and the exhaust gas conduit heater 44 can also comprise other types of heating devices, such as for example, cartridge type heaters or radiant heating devices such as infrared lamps and the like.

The gas inlet conduit 30 preferably comprises a nitrogen containing gas feed line and a silicon containing gas feed line. The feed lines are joined in an inlet gas manifold 60 which combines the gases at the deposition zone 24. Combining the gases at the deposition zone 24 limits the area of the apparatus 10 that is exposed to the process gas, thereby limiting the area on which condensates such as ammonium chloride deposit. Preferred inlet gas manifolds 60 are described in copending U.S. patent application Ser. No. 08/099,977, entitled "Gas Inlets for Wafers Processing Chamber," by H. Peter W. Hey, David K. Carlson, Roger N. Anderson, Norma Riley, and Mahalingam Venkatesan, which is filed on even date herewith and which is incorporated herein by this response.

The gas exhaust conduit 32 preferably comprises an exhaust manifold 70 that connects an exhaust line 72 to the deposition chamber 22. The exhaust line 72 has an isolation valve 74 and a pressure control valve 76 therein. Preferably, the exhaust manifold 70, exhaust line 72, and valves 74 and 76 are all heated by the exhaust gas conduit heater 44.

It is also preferable to maintain the chamber wall 23 at a temperature $T_h$ within the range of temperatures $\Delta T_h$ to prevent the deposition of silicon nitride and ammonium chloride condensate on the wall 23. The chamber wall 23 is heated by the radiant heat emitted by the first heater 40. Thus, the wall 23 can reach temperatures close to the temperature $T_d$, thereby resulting in the deposition of silicon nitride and other condensates on the walls 23. Alternatively, if the temperature of the wall 23 falls below the condensation temperature $T_c$, condensates such as ammonium chloride can form on the wall. These deposits are difficult to clean and can accumulate to flake off and form contaminants that deposit on the wafer surfaces. Thus, the temperature of the wall 23 is preferably maintained within the range of temperatures $\Delta T_h$.

Thus, preferably, the apparatus 10 further comprises means to maintain the temperature of the deposition chamber walls 23 at a temperature in the range $\Delta T_h$ to prevent the deposition of silicon nitride or condensate on the wall 23. In the embodiment shown in the drawings, the temperature of the wall 23 is maintained using a fluid such as water heated to a low temperature, the fluid circulating within channels 50 in the wall 23. The temperature at which the water is maintained depends on the deposition temperature $T_d$. As the value of $T_d$ increases, the temperature of the water is decreased in order to increase the rate of heat dissipation from the wall 23, and vice versa. When the first heater is set to provide a deposition temperature $T_d$ of about 750° C., the circulating water is preferably maintained at a temperature from about 40° to 80° C., and more preferably at a temperature from about 50° to 65° C.

To deposit silicon nitride on the substrate 28, the substrate 28 is placed into a loadlock transfer area (not shown) adjacent to the housing 20. The substrate is then transferred from the loadlock area to the deposition zone 24 via a slit valve (also not shown) in the deposition chamber 22. The loadlock transfer area is purged with nitrogen to maintain a substantially contaminant free and substantially non-oxidizing environment.

The silicon nitride film can be deposited on a wide variety of substrates including glasses, plastics, metals, and semiconducting wafer substrates, such as silicon and gallium arsenide wafers. Moreover, the silicon nitride layer can also be deposited below or above other layers such as polysilicon, $SiO_2$, boride, silicide or combinations of these layers.

During the deposition process, the deposition chamber 22 is typically maintained at a pressure from about 0.1 to about 1000 Torr, and more typically at a pressure from about 10 to about 200 Torr, and most typically at a pressure of about 100 Torr.

Preferably, a reducing gas such as hydrogen is used to purge the deposition chamber 22 before, during, and after the deposition process to remove any oxide layer that is formed on the substrate 28, and to prevent any additional oxide deposition. Details of the purging process are described in copending U.S. patent application Ser. No. 08/101,502, filed on even date herewith, entitled "Method for In-Situ Cleaning of Native Oxides from Silicon Surfaces," by David Carlson and H. Peter W. Hey, which is incorporated herein by this reference.

A process gas comprising a silicon containing gas and a nitrogen containing gas is then introduced into the deposition zone 24 through an inlet gas conduit 42. The silicon containing gas can be a gas such as silane, dicholorosilane, or tricholorosilane, and the nitrogen containing gas is typically a gas such as ammonia or nitrogen. In addition, the process gas can further comprise an inert or carrier gas such as for example nitrogen, helium or argon.

Typically, the volumetric flow ratio of silicon containing gas to nitrogen containing gas is from about 1:20 to about 1:1, and more typically, the flow ratio is from about 1:8 to about 1:4. When hydrogen is used to purge the deposition chamber 22, the volumetric flow ratio of silicon containing gas to hydrogen is typically from about 1:10 to about 1:1000, and more typically, from about 1:100 to about 1:500.

The flow rate of the process gases can vary with the gas flow characteristics of the apparatus 10 and the desired thickness or uniformity of the deposited silicon nitride film. The total process gas flow including the flow rates of the silicon containing gas, the nitrogen containing gas, and the hydrogen, is typically from about 1 to about 100 slm (standard liter per minute), and more typically from about 10 to about 50 slm.

To deposit silicon nitride on the substrate 28 from the process gas introduced into the deposition zone 24, the substrate 28 is heated to a temperature $T_d$. The temperature $T_d$ is sufficiently high to cause the process gas to deposit silicon nitride on the substrate 28. When the process gas comprises dicholorosilane and ammonia, $T_d$ is typically at least about 600° C., and more typically from about 700° to about 800° C.

EXAMPLES

The following examples demonstrate the processes and apparatus of the present invention. In these examples, a double dome single-wafer process chamber, namely a "CENTURA HT" low pressure CVD reactor sold by Applied Materials, Santa Clara, Calif., and described in U.S. Pat. Nos. 5,108,792 and 5,179,677, was modified to incorporate features of the present invention.

Example I

In prior experiments, silicon nitride films were deposited using process gas comprising dicholorosilane and ammonia and using known process conditions. In these experiments, excessive deposits formed in the inlet gas conduit 30 and exhaust gas conduit 32 causing blockage of the conduits 30 and 32 after about 3–5 deposition runs. These deposits in the conduits were determined by chemical analysis to be ammonium chloride. Silicon nitride deposits also formed on the deposition chamber walls 23. Thus, existing processes and apparatus were not effective for silicon nitride deposition.

The experiment of Example 1 was conducted to determine the effect of heating the inlet and exhaust gas conduits 30 and 32 with heating tape for reducing condensate deposition in the conduits. The experiment also provided useful data on thee rise in temperature effected by the heating tapes during a simulated deposition run.

A flexible silicone heating tape having a power density of about 5 watts/sq. in. fabricated by WATLOW, St. Louis, Mo., was securely wrapped around the inlet gas conduit 30 to form the inlet gas conduit heater 42. Another similar heating tape was wrapped around the exhaust gas line 72, the isolation valve 74 and the pressure control valve 76 to form the exhaust gas conduit heater 44. Thermocouples were placed at various locations in the apparatus 10 to measure the temperature at that location. The first heater 40 was then set to heat the holder 26 to a temperature of about 750° C. Table I shows the temperatures of various components of the apparatus 10 as measured with and without the heating tapes 42 switched on. The measured rise in temperatures demonstrated that the components of the apparatus 10 could be effectively heated using heating tape.

TABLE I

TEMPERATURES OF COMPONENT HEATING TAPES

| COMPONENT | HEATING TAPE (°C.) | |
|---|---|---|
| | OFF | ON |
| Inlet Gas Conduit 30 | 114 | 151 |
| Chamber Walls 23 | 175 | 175 |
| Exhaust Gas Conduit 32 (inside)[1] | 107 | 153 |
| Exhaust Gas Conduit 32 (wall)[1] | 89 | 141 |

NOTES:
[1]The temperature of the exhaust gas conduit was measured inside the conduit and at the wall of the conduit.

Example II

In this example, silicon nitride was deposited on a silicon wafer 28. The silicon wafer 28 had a thickness of about 0.73 mm and a diameter of about 200 mm (8 inches), and was loaded into the deposition chamber 22 from a load lock (not shown) maintained at a pressure of 100 Torr of nitrogen.

The wafer 28 was introduced into the deposition chamber 22 at room temperature, and placed on the radiatively heated holder 26. The wafer typically equilibrated within 60 seconds and was at a temperature of about 0° C. to 20° C. higher than the temperature of the holder 26. When the wafer 28 achieved equilibrium temperature, the pressure in chamber 22 was established using a flow of hydrogen and controlled by the pressure control valve 76. The heating tapes 42 and 44 were used to heat the inlet and exhaust gas conduits and 32. In addition, water at a temperature of about 70° C. was flowed in the channels 50 to maintain the temperature of the chamber walls 23 within the range $\Delta T_h$.

The process conditions that were used for the deposition process are listed in Table II. The "set point" numbers represent the target process conditions and the "actual" numbers are the actual process conditions. Hydrogen was flowed during the process of transferring the wafer 28 from the loadlock area to the deposition chamber 22, throughout the deposition process, and afterward when the wafer 28 was transferred out of the chamber 22. Dicholorosilane and ammonia was introduced into the chamber 22 at the required flow rate through the gas inlet conduit 30, and the total run time was about 315 seconds.

TABLE II

DEPOSITION PROCESS CONDITIONS

| | SET POINT | ACTUAL |
|---|---|---|
| Hydrogen (slm) | 18.0 | 17.75 |
| Dicholorosilane (sccm) | 60.0 | 65.23 |
| Ammonia (sccm) | 320 | 320 |
| Slit Valve Purge (slm) | 10.0 | 9.94 |
| Lower Chamber 84 Purge (slm) | 2.0 | 1.99 |
| Pressure (torr) | 100.0 | 101.53 |
| Deposition Temperature (°C.) | 720.0 | 720–735 |
| Deposition Time (seconds) | 60 | 60 |
| Total Run Time (seconds) | 315 | 315 |

After deposition the wafer was inspected using laser ellipsometry. It was determined that a uniform silicon nitride layer having a thickness of about 70 Å was deposited. On inspecting the apparatus 10, it was found that the condensate deposits were substantially reduced and it was also found that the silicon nitride deposits on the chamber walls 23 were also substantially reduced. Thus, the deposition process provided a substantially uniform layer of silicon nitride on a large diameter wafer 28 with reduced condensate and wall deposits.

Although the present invention has been described in considerable detail with regard to the preferred versions thereof, other versions are possible. For example, the configuration of the reactor can be different from the embodiment shown in the drawings. Therefore, the appended claims should not be limited to the descriptions of the preferred versions contained herein.

What is claimed is:

1. A process for depositing silicon nitride on a substrate in a deposition chamber having a surrounding wall that defines a deposition zone, the process comprising the steps of:

(a) placing the substrate in the deposition zone;

(b) introducing a process gas comprising a silicon containing gas and a nitrogen containing gas into the deposition zone through an inlet gas conduit;

(c) heating the substrate to a temperature $T_d$, the temperature $T_d$ being sufficiently high to cause the process gas to deposit the silicon nitride on the substrate, with the resultant formation of process gas byproducts;

(d) exhausting the process gas byproducts through an exhaust gas conduit; and (e) heating at least one of the inlet and exhaust gas conduits to a temperature $T_h$ within the range $\Delta T_h$, wherein all the temperatures $T_h$ in the range $\Delta T_h$ are sufficiently higher than $t_c$, the temperature at which the process gas condenses in the inlet and exhaust gas conduits, that substantially no condensate deposits in the gas conduits, and wherein all temperatures $T_h$ are sufficiently lower than the deposition temperature $T_d$ that substantially no silicon nitride deposits in the gas conduits.

2. The process of claim 1, wherein the wall defining the deposition zone is maintained at a temperature $T_h$ within the range $\Delta T_h$.

3. The process of claim 1, wherein the exhaust gas conduit comprises an exhaust line having valves therein, and an exhaust manifold connecting the exhaust line to the deposition zone, and wherein the exhaust manifold, exhaust line and valves are all heated to a temperature $T_h$ within the range $\Delta T_h$.

4. The process of claim 1, wherein the temperature range $\Delta T_h$ is from about 80° C. to about 250° C.

5. The process of claim 4, wherein the temperature range $\Delta T_h$ is from about 100° C. to about 170° C.

6. The process of claim 1, wherein the silicon containing gas is selected from the group consisting of silane, dicholorosilane, and tricholorosilane.

7. The process of claim 1, wherein the nitrogen containing gas is selected from the group consisting of ammonia and nitrogen.

8. A process for depositing silicon nitride on a substrate in a deposition chamber having a surrounding wall that defines a deposition zone, the process comprising the steps of:

(a) placing the substrate in a deposition zone;

(b) introducing a process gas comprising dicholorosilane and ammonia into the deposition zone through an inlet gas conduit;

(c) heating the substrate to a temperature $T_d$, the temperature $T_d$ being sufficiently high to cause the process gas to deposit the silicon nitride on the substrate with the resultant formation of process gas byproducts;

(d) exhausting process gas byproducts through an exhaust gas conduit; and (e) heating the inlet and exhaust gas conduits to a temperature $T_h$ within the range $\Delta T_h$, where $\Delta T_h$ is from about 80° C. to about 250° C., so that substantially no condensate or silicon nitride deposits in the gas conduits.

9. The process of claim 8, wherein the wall defining the deposition zone is maintained at a temperature $T_h$ within the range $\Delta T_h$.

10. The process of claim 8, wherein the exhaust gas conduit comprises an exhaust line having valves therein, and an exhaust manifold connecting the exhaust line to the deposition zone, and wherein the exhaust manifold, exhaust line and valves are all heated to a temperature $T_h$ within the range $\Delta T_h$.

11. The process of claim 8, wherein the temperature range $\Delta T_h$ is from about 100° C. to about 170° C.

* * * * *